US008864935B2

(12) United States Patent
Fair et al.

(10) Patent No.: US 8,864,935 B2
(45) Date of Patent: Oct. 21, 2014

(54) PLASMA GENERATOR APPARATUS

(75) Inventors: James A. Fair, Mountain View, CA (US); Vincent Decaux, Mountain View, CA (US); Anirban Guha, Milpitas, CA (US); David Cheung, Foster City, CA (US); John Keller, Newburgh, NY (US); Peter Jagusch, Los Gatos, CA (US)

(73) Assignee: Novellus Systems, Inc., Fremont, CA (US)

( * ) Notice: Subject to any disclaimer, the term of this patent is extended or adjusted under 35 U.S.C. 154(b) by 24 days.

(21) Appl. No.: 13/493,655

(22) Filed: Jun. 11, 2012

(65) Prior Publication Data

US 2012/0247674 A1   Oct. 4, 2012

Related U.S. Application Data

(63) Continuation of application No. 11/616,324, filed on Dec. 27, 2006, now abandoned.

(51) Int. Cl.
*C23C 16/00* (2006.01)
*C23F 1/00* (2006.01)
*H01L 21/306* (2006.01)

(52) U.S. Cl.
USPC ............. 156/345.33; 118/715; 118/723 I; 118/723 IR; 156/345.48; 156/345.49

(58) Field of Classification Search
CPC .................. C23C 16/45563; C23C 16/45568
USPC ......... 156/345.48, 345.49; 118/723 I, 723 IR, 118/723 AN; 315/111.21, 111.51
See application file for complete search history.

(56) References Cited

U.S. PATENT DOCUMENTS

| 2,518,709 A | 8/1950 | Mosby, Jr. |
| 2,874,001 A | 2/1959 | Webb |
| 4,421,592 A | 12/1983 | Shuskus et al. |
| 4,718,976 A | 1/1988 | Fujimura |
| 4,938,839 A | 7/1990 | Fujimura et al. |
| 5,231,334 A | 7/1993 | Paranjpe |

(Continued)

FOREIGN PATENT DOCUMENTS

| JP | 2001-23797 | * | 1/2001 | ............. C23C 16/50 |
| JP | 3691528 | | 6/2005 | |
| WO | 2008/143659 | | 11/2008 | |

OTHER PUBLICATIONS

English Machine Translation JP200123797, Satoyoshi dated Jan. 28, 2001.*

(Continued)

*Primary Examiner* — Rakesh Dhingra
(74) *Attorney, Agent, or Firm* — Weaver Austin Villeneuve & Sampson LLP (57) ABSTRACT

Embodiments of a plasma generator apparatus for ashing a work piece are provided. The apparatus includes a container adapted for continuous gas flow there through from an inlet end to an outlet end thereof. The container is fabricated of a dielectric material and adapted for ionization therein of a portion of at least one component of gas flowing therethrough. A gas flow distributor is configured to direct gas flow to a region within the container and a coil surrounds at least a portion of side walls of the container adjacent the region of the container to which the gas flow distributor directs gas flow. A radio frequency generator is coupled to the coil.

19 Claims, 6 Drawing Sheets

(56) References Cited

U.S. PATENT DOCUMENTS

| | | | |
|---|---|---|---|
| 5,411,624 A | 5/1995 | Hirano et al. | |
| 5,436,528 A | 7/1995 | Paranjpe | |
| 5,439,524 A | 8/1995 | Cain et al. | |
| 5,503,881 A | 4/1996 | Cain et al. | |
| 5,556,501 A | 9/1996 | Collins et al. | |
| 5,614,055 A | 3/1997 | Fairbairn et al. | |
| 5,855,725 A | 1/1999 | Sakai | |
| 5,919,382 A | 7/1999 | Qian et al. | |
| 6,013,155 A | 1/2000 | McMillin et al. | |
| 6,054,013 A * | 4/2000 | Collins et al. | 156/345.27 |
| 6,086,679 A | 7/2000 | Lee et al. | |
| 6,164,241 A | 12/2000 | Chen et al. | |
| 6,203,657 B1 | 3/2001 | Collison et al. | |
| 6,229,264 B1 | 5/2001 | Ni et al. | |
| 6,247,425 B1 | 6/2001 | Lymberopoulos et al. | |
| 6,248,250 B1 | 6/2001 | Hanawa et al. | |
| 6,331,754 B1 | 12/2001 | Satoyoshi et al. | |
| 6,361,644 B1 | 3/2002 | Collins | |
| 6,379,576 B2 * | 4/2002 | Luo et al. | 216/67 |
| 6,444,084 B1 | 9/2002 | Collins | |
| 6,450,117 B1 | 9/2002 | Murugesh et al. | |
| 6,478,924 B1 * | 11/2002 | Shamouilian et al. | 156/345.48 |
| 6,495,963 B1 | 12/2002 | Bennett | |
| 6,551,447 B1 | 4/2003 | Savas et al. | |
| 6,565,661 B1 | 5/2003 | Nguyen | |
| 6,716,302 B2 | 4/2004 | Carducci et al. | |
| 6,797,639 B2 | 9/2004 | Carducci et al. | |
| 6,914,207 B2 | 7/2005 | Kawaguchi et al. | |
| 7,361,228 B2 | 4/2008 | Choi et al. | |
| 7,404,863 B2 | 7/2008 | Bergman | |
| 7,482,247 B1 | 1/2009 | Papasouliotis et al. | |
| 8,110,068 B2 | 2/2012 | Qiu et al. | |
| 2001/0006093 A1 | 7/2001 | Tabuchi et al. | |
| 2001/0047760 A1 | 12/2001 | Moslehi | |
| 2002/0033233 A1 | 3/2002 | Savas | |
| 2002/0039625 A1 | 4/2002 | Powell et al. | |
| 2002/0088545 A1 | 7/2002 | Lee et al. | |
| 2003/0041971 A1 | 3/2003 | Kido et al. | |
| 2003/0070620 A1 * | 4/2003 | Cooperberg et al. | 118/723 AN |
| 2004/0221815 A1 | 11/2004 | Fukuda et al. | |
| 2005/0011447 A1 | 1/2005 | Fink | |
| 2005/0211168 A1 | 9/2005 | Yamada et al. | |
| 2006/0000802 A1 | 1/2006 | Kumar et al. | |
| 2006/0021574 A1 | 2/2006 | Armour et al. | |
| 2006/0070702 A1 | 4/2006 | Kido et al. | |
| 2006/0090852 A1 | 5/2006 | Kido et al. | |
| 2006/0090853 A1 | 5/2006 | Kido et al. | |
| 2006/0130756 A1 | 6/2006 | Liang et al. | |
| 2006/0130759 A1 | 6/2006 | Kido et al. | |
| 2006/0157199 A1 | 7/2006 | Kido et al. | |
| 2006/0157201 A1 | 7/2006 | Hoffman et al. | |
| 2007/0138134 A1 | 6/2007 | Hsieh et al. | |
| 2007/0170156 A1 | 7/2007 | Hayashi | |
| 2008/0156264 A1 | 7/2008 | Fair et al. | |
| 2008/0156631 A1 | 7/2008 | Fair et al. | |
| 2009/0236313 A1 | 9/2009 | Qiu et al. | |
| 2009/0250334 A1 | 10/2009 | Qiu et al. | |
| 2010/0294860 A1 | 11/2010 | Hsieh | |
| 2010/0300359 A1 | 12/2010 | Armour et al. | |
| 2012/0097331 A1 | 4/2012 | Qui et al. | |

OTHER PUBLICATIONS

U.S. Appl. No. 12/052,401, Office Action mailed Mar. 29, 2011.
U.S. Appl. No. 12/052,401, Notice of Allowance mailed Sep. 9, 2011.
U.S. Appl. No. 12/209,526, "Plasma generator systems and methods of forming plasma," Caron et al., filed Sep. 12, 2008.
U.S. Appl. No. 12/209,526, Office Action mailed Dec. 9, 2011.
U.S. Appl. No. 12/062,052, Office Action mailed Dec. 2, 2011.
U.S. Appl. No. 11/616,324, Office Action mailed Jul. 20, 2009.
U.S. Appl. No. 11/616,324, Office Action mailed Jan. 4, 2010.
U.S. Appl. No. 11/616,324, Office Action mailed Nov. 10, 2010.
U.S. Appl. No. 11/616,324, Office Action mailed Apr. 12, 2011.
U.S. Appl. No. 11/616,324, Office Action mailed Jun. 23, 2011.
U.S. Appl. No. 11/616,324, Notice of Allowance mailed Nov. 29, 2011.
U.S. Appl. No. 11/616,324, Allowed Claims, Nov. 29, 2011.
Savas, S. et al., "Using an ICP-based strip system to perform resist and barrier-layer removal in copper low-k processes," MICRO, Oct.; Nov. 2004.
Luo, L. et al., "Characterization of a selectable-mode inductively coupled plasma (ICPsm) source for advanced dry residue removal applications," Mattson Technology, Inc., Abstract, 1998, ICPSM.
WO patent application No. PCT/US2007/064554, International Search Report and Written Opinion mailed Nov. 4, 2008.
U.S. Appl. No. 11/616,326, Office Action mailed Sep. 28, 2009.
U.S. Appl. No. 11/616,326, Office Action mailed Apr. 15, 2010.
U.S. Appl. No. 13/342,757, "Gas flow distribution receptacles, plasma generator systems, and methods for performing plasma stripping processes," Qiu et al., filed Jan. 3, 2012.
U.S. Appl. No. 11/616,324, Final Office Action, Apr. 30, 2012.
U.S. Appl. No. 12/062,052, Final Office Action mailed May 9, 2012.
U.S. Appl. No. 12/209,526, Final Office Action mailed May 24, 2012.
US Supplemental Notice of Allowability, dated Dec. 7, 2011, issued in U.S. Appl. No. 11/616,324.
US Final Office Action, dated Oct. 19, 2012, issued in U.S. Appl. No. 11/616,324.
US Office Action, dated Mar. 27, 2013, issued in U.S. Appl. No. 11/616,324.
US Final Office Action, dated Sep. 26, 2013, issued in U.S. Appl. No. 11/616,324.
Korean Notice of Preliminary Rejection dated Mar. 11, 2013 issued in KR 10-2009-7012747.
Korean Second Notice of Preliminary Rejection dated Sep. 30, 2013 issued in KR 10-2009-7012747.
KR Notice of Preliminary Rejection dated Aug. 9, 2012 issued in Korean Application No. 20-2008-0014137.

* cited by examiner

PLASMA GENERATOR APPARATUS

CROSS-REFERENCE TO RELATED APPLICATIONS

This application is a continuation of and claims priority from U.S. patent application Ser. No. 11/616,324, filed Dec. 27, 2006, titled "PLASMA GENERATOR APPARATUS," all of which is incorporated herein by this reference.

TECHNICAL FIELD

The present technology relates generally to apparatus used in the fabrication of semiconductor devices, and more particularly, the present technology relates to plasma generator apparatus for generating plasma used in ashing and surface treatment procedures.

BACKGROUND

In semiconductor manufacturing, plasma ashing is the process of removing the photoresist from an etched wafer. Plasma in this context is an ionized form of a gas. A gas ionizing apparatus, also referred to as a plasma generator, produces a monatomic reactive species of oxygen or another gas required for the ashing process. Oxygen in its monatomic or single atom form, as O rather than $O_2$, is the most common reactive species. The reactive species combines with the photoresist to form ash which is removed from the work piece with a vacuum pump.

Typically, monatomic oxygen plasma is created by exposing oxygen gas ($O_2$) to a source of energy, such as a RF discharge. At the same time, many charged species, i.e. ions and electrons, are formed which could potentially damage the wafer. Newer, smaller circuitry is increasingly susceptible to damage by charged particles. Originally, plasma was generated in the process chamber, but as the need to avoid charged particles has increased, some machines now use a downstream plasma configuration, where plasma is formed remotely and channeled to the wafer. This reduces damage to the wafer surface.

Monatomic oxygen is electrically neutral and although it does recombine during the channeling, it does so at a slower rate than the positively or negatively charged particles, which attract one another. Effectively, this means that when substantially all of the charged particles have been neutralized, the reactive neutral species remains and is available for the ashing process.

Current plasma generating apparatus present a variety of challenges during ashing procedures. Generally, plasma is generated using a coil, often copper, wrapped around a dielectric tube, such as quartz or aluminum/sapphire tube. The coil is energized with a radio frequency (RF) voltage from an appropriate RF generator. Plasma formation is initiated by capacitively coupling the electric field through the quartz to the rarefied gas inside the quartz tube. As the power level and current through the coil are increased, the plasma switches from a capacitively coupled mode to an inductively coupled mode. Significant voltages exist on the coil. Difficulties arise in trying to isolate the high voltage components to prevent these components from breaking down and arcing to cause damage to other components. In addition, the high voltages generate a high electric field across the quartz and can cause significant ion bombardment and sputtering on the inside of the quartz tube thus reducing its lifespan and increasing its maintenance needs. A reduction in the ion bombardment energy may be helpful.

Figure 1:
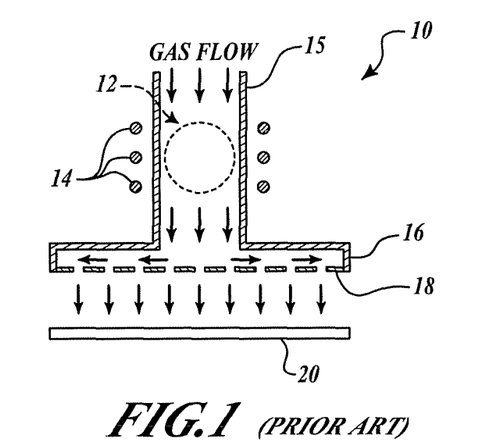
FIG. 1 is a simplified cross sectional view of a prior art plasma generator for use in ashing in semiconductor fabrication.

In addition, as illustrated in schematic cross section in FIG. 1, prior art plasma sources 10 for ashing have smaller diameter plasma generation regions 12, in quartz cylindrical containers 15, than the work pieces 20 that are to be treated. Accordingly, plasma flows from a smaller diameter plasma generation region 12 of the quartz cylinder 15 of about 76 mm diameter that is surrounded by a RF induction coil 14, to a larger diameter distribution region 16 of a diameter approximating the work piece diameter, often about 300 mm diameter. In the distribution region 16, the oxygen atoms (O), which are the desired product in the plasma generator effluent, are spread out or dispersed over a larger cross sectional area than that of the generation region 12 in an attempt to control the flux of O atoms to the surface of a work piece 20. In addition, the distribution region 16 includes a diffuser 18 of some kind to further facilitate a desired plasma distribution over the surface of the work piece 20. Significant numbers of O atoms are lost in this process.

Figure 2:
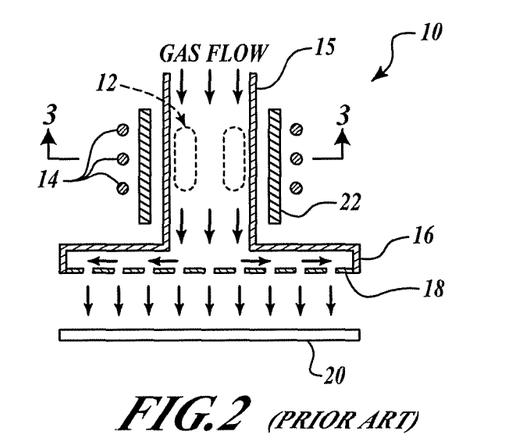
FIG. 2 is a simplified cross sectional view of a prior art plasma generator with a Faraday shield for use in ashing in semiconductor fabrication.

Ion bombardment of the quartz cylinder 15 poses another significant challenge. When a small diameter plasma source 10 is used, the plasma density should be very high in order to generate enough O atoms to perform ashing at an acceptable rate. This high plasma density coupled with the high energy fields (E-fields) present in the coil 14 cause significant ion bombardment of the quartz container 15 and a reduced container lifespan. One method to ameliorate this effect is to place a Faraday shield 22 between the quartz container 15 and the coil 14, as illustrated in the schematic cross section of FIG. 2. This effectively prevents the E-fields from penetrating the quartz container 15 and consequently reduces the sputtering of the quartz container 15. The addition of the Faraday shield 22 reduces one problem at the expense of creating additional problems. The Faraday shield 22 is complex, increases cost, requires water cooling and consumes power that would otherwise be delivered to the plasma.

Figure 3:
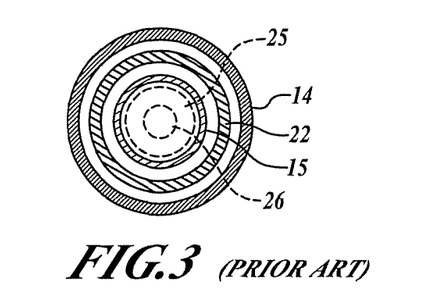
FIG. 3 is a cross sectional view along line 3-3 of FIG. 2.

In addition, present day plasma generator apparatus suffer from non-uniform plasma production. Generally, when an oxygen-containing gas flows through the container, plasma generation is initiated in the tube adjacent the coil. But since the E-field has limited penetration into the container, the peak area for energy dissipation is near the inner wall of the container. Due to this limited penetration of the E-field, the plasma forms a ring 25 inside the quartz container 15, as seen from above, and as schematically shown in FIG. 3, with the area of peak power dissipation being near the inner wall of quartz container 15. There is a hole 26 corresponding to a nearly field-free region where there is little or no energy dissipation from the excitation fields. For example, in the 76.2 mm diameter tube on the Gamma 2130™ of Novellus Systems, Inc. [San Jose Calif.], the size of the central hole 26 in the ring 25 is small, although quite visible under certain conditions. While gas flows through the entire cross section of the quartz container 15, oxygen in the gas flow is mainly dissociated in the ring 25 to produce 0 atoms. Very little of the oxygen in the remainder of the gas flow is dissociated to 0 atoms. Accordingly, a large portion of the incoming gas flow, namely gas in the vicinity of the center of the cylindrical gas flow in container 15, is not subjected to sufficient energy for ionization.

In addition, present day plasma generators are difficult to adapt to ashing larger wafers. If the quartz container 15 is increased in diameter, the peak plasma region remains approximately the same size and is still located near the wall. The hole 26 in the ring 25 increases in size dramatically as the diameter of the quartz container 15 is increased. The majority of the gas flows down the center of the quartz container 15 and is never directly ionized. Thus, few O atoms are produced in the central region of the quartz container 15. The efficiency of producing O atoms in larger diameter quartz containers is therefore expected to be low.

Accordingly, it is desirable to provide an improved plasma generation apparatus that is suitable for use in ashing procedures in semiconductor fabrication. It is also desirable to provide an apparatus that is able to provide a more uniform distribution of O atoms over a large diameter work piece, such as a 300 mm or larger wafer. It is further desirable to provide a plasma generator that does not require Faraday shields, but that also provides an acceptable quartz container lifespan. In addition, it is desirable to provide a plasma generation apparatus and/or process that converts oxygen more efficiently to O atoms. Other desirable features and characteristics of the present technology will become apparent from the subsequent detailed description and the appended claims, taken in conjunction with the accompanying drawings and the foregoing technical field and background.

BRIEF DESCRIPTION OF THE DRAWINGS

A more complete understanding of the present technology may be derived by referring to the detailed description and claims when considered in conjunction with the following figures, wherein like reference numbers denote like elements throughout the figures and wherein:

FIGS. 10 A-B illustrate simplified schematic representations of embodiments of symmetrical multi-segmented induction coils for use with plasma generators in accordance with exemplary embodiments.

DETAILED DESCRIPTION

The following detailed description is merely exemplary in nature and is not intended to limit the described embodiments or the application and uses of the described embodiments. Furthermore, there is no intention to be bound by any expressed or implied theory presented in the preceding technical field, background, brief summary or the following detailed description.

In accordance with an exemplary embodiment, a plasma generator apparatus includes means for diverting a portion of an incoming gas flow into a region of higher plasma density than another region of the apparatus. The region of higher gas density is located in a container of suitable dielectric material, such as a quartz container, and specifically within or proximate the strongest region of a plasma-generating energy field to which the container is subjected. Accordingly, a higher proportion of the incoming ionizable components in the gas flow is ionized (or "converted to plasma") when sufficient appropriate excitation energy is applied.

Another embodiment provides symmetrical segmented coils for generation of an electrical field of a frequency that will generate ionization of a gaseous component in a plasma generator. The use of such coils, as explained below, reduces or eliminates the necessity for a Faraday shield. This results in significant cost savings. In addition, by reducing the creation of free radicals that are produced at high voltages there is reduced etching of the quartz tubes often used in the plasma generator. Thus, the symmetrical segmented coils increase the useful life of the quartz tubes.

Figure 5A:
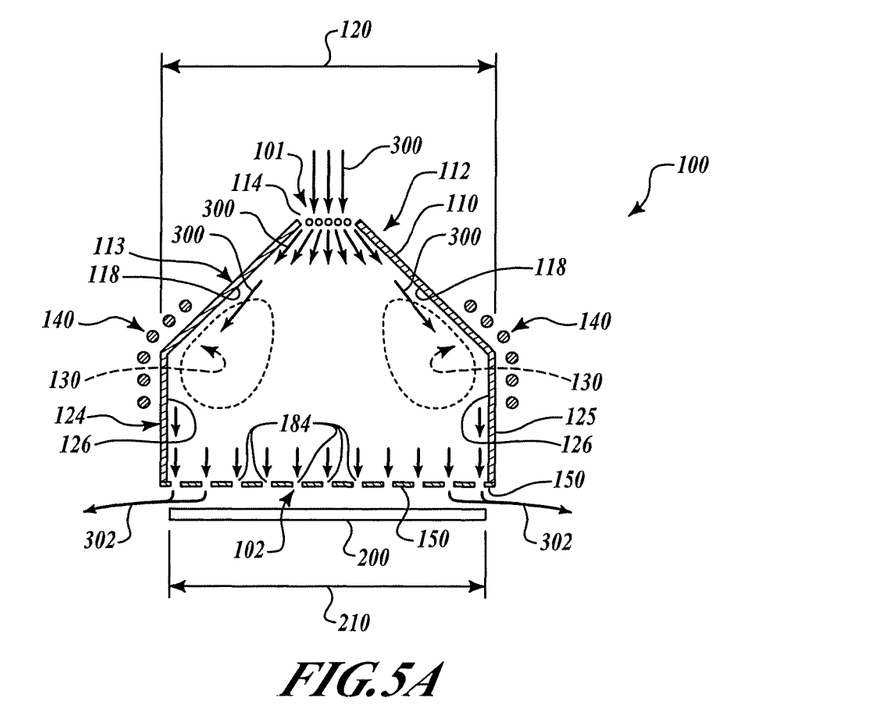
FIG. 5A is a simplified side view in cross section of a large diameter plasma generator in accordance with an exemplary embodiment that utilizes an embodiment of a gas dispersion nozzle, and a quartz container with a conical upper portion.
Figure 5B:
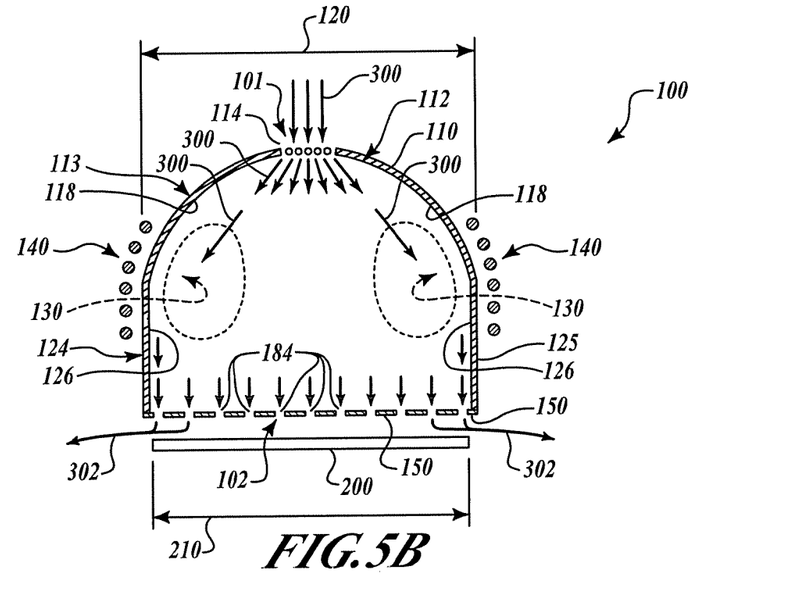
FIG. 5B is a simplified side view in cross section of a large diameter plasma generator in accordance with an exemplary embodiment that utilizes an embodiment of a gas dispersion nozzle, and a domed quartz container.

An example embodiment of a plasma generator apparatus 100 with a conical upper portion is illustrated in FIG. 5A, and another embodiment with a domed upper portion is illustrated in FIG. 5B. The following description applies to both figures, except with respect to the differences relating to the shape of the upper portion of the container. The plasma generator is not limited to use in semiconductor fabrication to ash work pieces, but may also be used in other applications. The apparatus described herein can also be used for general surface treatment, such as cleaning organic material from any surface and not just in the semiconductor industry. Coupled with different chemistry that contains nitrogen, oxygen, hydrogen and compounds that might contain carbon and fluorine, this apparatus may be used for cleaning and surface treatment of a variety of work pieces, for example: cleaning organic material from parts, removing biological contamination, enhancing adhesion prior to deposition of another layer, reduction of metal oxides, or for etching a range of materials.

The plasma generator 100 includes an upper portion 110 that is conical (FIG. 5A) or domed (FIG. 5B) and that caps a gas flow tube 125. The apex 112 of the cone 110, or highest point 112 of the dome 110, is uppermost for receiving gas entering in gas stream 300 (depicted by arrows in the drawings) at a plasma generator inlet 101. The cone or dome 110 and tube 125 of the plasma generator 100 may be fabricated of quartz, as is conventional, or another suitable material. The ionizable gas component in the gas stream 300 may be, for example oxygen, argon, helium, hydrogen, nitrogen, and fluorine-containing compounds. The diameter 120 of the tube 125 may be from about 200 mm up to 500 mm and/or typically about 300 mm for a work piece that approximates that size. The gas flow tube 125 has a larger diameter 120 with features to permit dispersion of plasma generated across the entire cross section of the larger diameter container 100 in which the plasma is generated. The term "larger" diameter in the specification and claims with reference to a container, within which plasma is generated, means a container diameter that approximates, but may not precisely equal, the diameter of a work piece to be subjected to ashing. In certain embodiments the larger diameter therefore may encompass a cylinder 125 having a diameter 120 in excess of about 200 mm, or in the range from about 300 mm to about 500 mm or more. A larger diameter may be typically at least about 300 mm for a work piece of that size, or more for larger work pieces. In the embodiment shown, the apex 112 of the cone 110, or highest point 112 of the dome 110, has a gas distribution nozzle 114 with a plurality of through holes 116 disposed in the nozzle 114, as shown more clearly in the top view of FIG. 7A. The through holes 116 direct incoming gas along the sloping inner sidewalls 118 of the cone or dome 110 toward the region of higher plasma density 130.

Figure 7A:
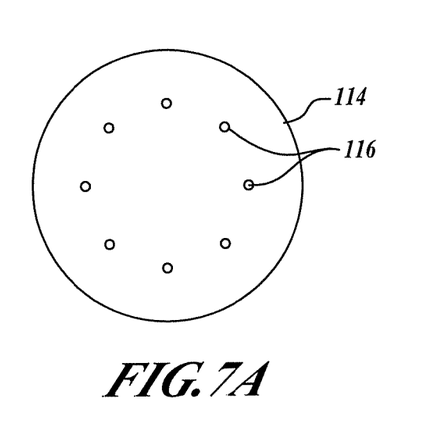
FIG. 7A is a simplified top view of a surface of an exemplary nozzle used in connection with plasma generators in accordance with exemplary embodiments.
Figure 7B:
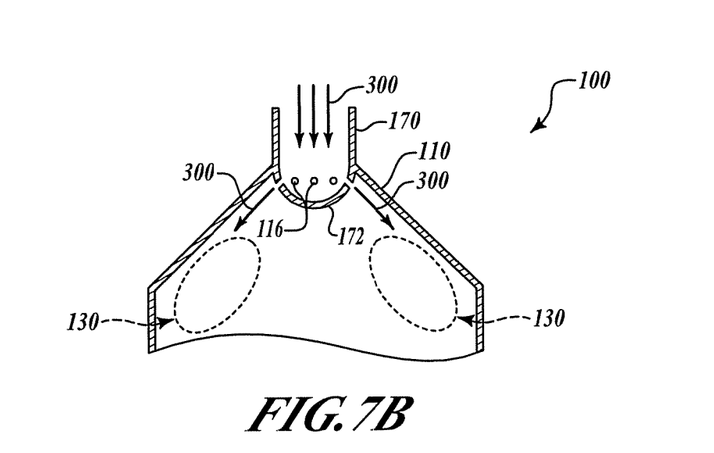
FIG. 7B is a simplified side view in cross section of a nozzle with hemispherical outlet end used in connection with plasma generators in accordance with exemplary embodiments.

The nozzle 114 shown in top view in FIG. 7A may be spherical, hemispherical or pyramidal, or of any other suitable shape. Another exemplary embodiment of a nozzle 170 with a hemispherical-tip 172 is illustrated in FIG. 7B. The nozzle tip 172 has a plurality of through holes 116 therein to direct gas along inner surfaces of walls of the cone 110 (or dome, if it is a domed container) to a region of higher gas density 130 for plasma generation in that region.

Referring to FIGS. 5A-B and FIG. 7A, the nozzle 114 directs gas flow via through holes 116 (shown in FIG. 7A). The gas exiting the through holes 116 (gas shown by downstream arrows 300 in the Figures) is directed to preferentially flow along the inner sidewalls 118 of cone or dome 110. The gas flow then impacts the inner walls 126 of the gas flow tube 125. The impact area is in the higher plasma region 130 which encompasses the intersection of inner sidewalls 118 and inner tube walls 126. The directed gas flow creates a region 130 of high gas pressure (high gas density) as the gas flow changes direction from flowing parallel to the inner sidewalls 118 of the dome 110 to flowing downward in tube 125 parallel to its inner walls 126. An energizing coil 140 surrounds the outer surface 113 of the cone or dome 110 and the outer surface 124 of the tube 125 to supply energy at the appropriate frequency into this region 130 to ionize gas components.

Because a large proportion, or even a major portion, of the gas flow is directed by the nozzle 114 and the container inner walls 118 into region 130, region 130 is a zone of highest plasma density 130. Excitation energy is applied from the outside of the tubular container 125 directly into this region 130. This permits more efficient gas component ionization because it ameliorates the effect of the energy level diminishing (and ionization decreasing) as the energy penetrates farther into the container. Of course, the flowing of more gas through the region of highest power dissipation, region 130, increases the production of radicals and atoms as well, in this case O atoms.

A gas distributor plate 150 is disposed at the exit end 102 of the generator 100. This gas distributor plate 150 has a plurality of through holes, or is of a porous construction. It provides means to control the O atom flux that impinges upon the work piece being treated. As the gas impinges upon and travels through the gas distributor plate 150, some charged species are neutralized thereby reducing the potential for charged particle damage to the work piece 200.

In accordance with another exemplary embodiment, a diameter 120 of the tube 125 and a diameter 210 of work piece 200 are approximately the same. While equality of diameter is not necessary, embodiments may have equal diameters of tube 125 and work piece 200, or diameters that approximate equal size. This feature significantly or completely reduces the need to expand the tube 125 near its exit end 102 to approximate the work piece diameter to facilitate distribution of the gas flow. In general, it is preferable that a characteristic dimension of the apparatus, such as tube diameter in the example of a quartz cylinder, approximates a characteristic dimension of a work piece, such as the diameter of a circular work piece surface that is presented transverse to the direction of gas flow. In this regard, the plasma generation region is increased in size thereby allowing a reduction in overall plasma density while still increasing the O atom production generated in the flowing gas. Increasing the volume of the plasma reduces the plasma density in the region near the container wall. This in turn results in less ion bombardment and less container wall heating.

Figure 6:
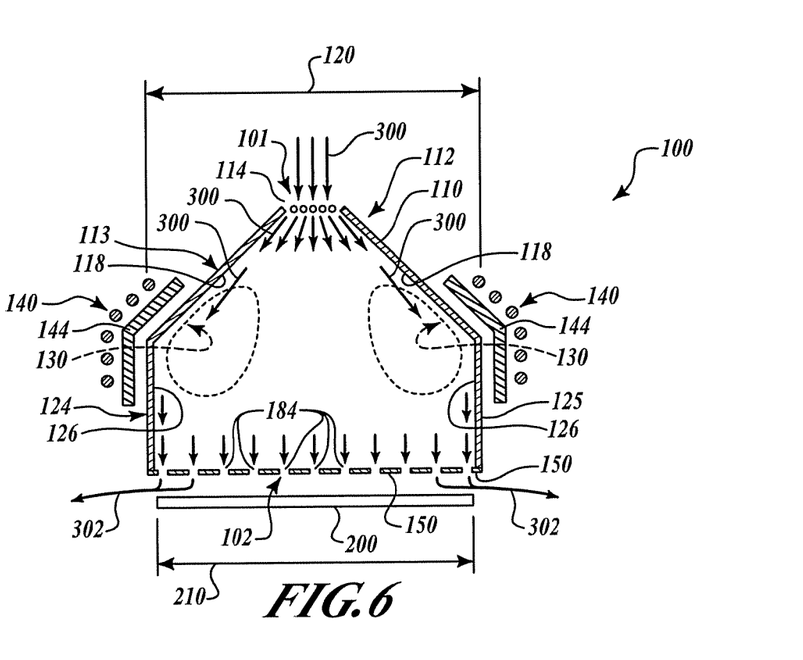
FIG. 6 is a simplified side view in cross section of a large diameter plasma generator in accordance with an exemplary embodiment that utilizes an embodiment of a gas dispersion nozzle, and a domed quartz container, with a Faraday shield interposed between the RF coil and the quartz container.

The plasma generator 100 may be used in conjunction with a Faraday shield 144, shown in FIG. 6, or may be used in conjunction with an induction coil circuit 160 that has a symmetrical coil 140 that has reduced peak voltage, as discussed below. Preferably, but not necessarily, to reduce damage to the quartz components (dome 110 and tube 125) the peak voltage $V_p$ should be reduced by a factor of about 2 or even by a factor of about 4, if necessary to protect the container from premature aging.

Figure 4:
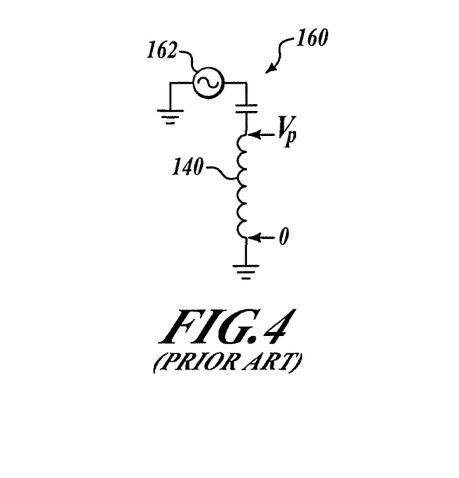
FIG. 4 is a simplified schematic of an induction coil typical of prior art plasma generators.
Figure 10A:
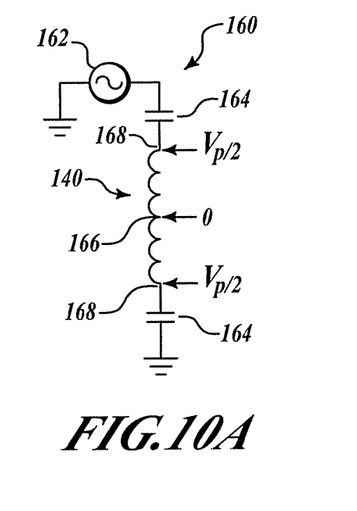

As a preliminary matter, the prior art of driving the induction circuit 160 is shown in FIG. 4. One end of the coil 140 is grounded and the other end is powered by a high frequency alternating current generator 162 through a matching network and capacitor. The peak voltage $V_p$ is seen at one end of the coil, and the other end is grounded. According to an exemplary embodiment of the present technology, the induction circuit 160 is configured, as shown in FIG. 10A, so that there are two capacitors 164, one outside each end of the coil 140. This configuration, and configurations like this example, will be referred to as a "symmetrical coil" configuration. The capacitors 164 are chosen such that the total impedance of each capacitor is one half the impedance of the original capacitor shown in FIG. 4. This maintains the total impedance of the capacitor-coil induction circuit 160 unchanged. Accordingly, the voltage drop $V_p$ across the entire coil 140 will be identical for the same current flowing through the coil 140 and, therefore, the resulting plasma generation capability will be the same. Thus, instead of a real ground (zero voltage, for example) located at only the end of the coil 140 as in FIG. 4, there is a now a pseudo ground (also zero voltage like the real ground, in this example) located at the center 166 of the coil 140 as well. This means that the highest voltage seen on the coil relative to ground at points 168 is $V_p/2$. This reduces the peak voltage by a factor of 2, and thereby reduces all electric fields by a factor of 2. Furthermore, this also reduces the electrical field across the quartz walls of the plasma generator (which reduces ion bombardment energy) by a factor of 2. It also reduces all of the other electrical standoff voltage requirements by a factor of 2.

Figure 10B:
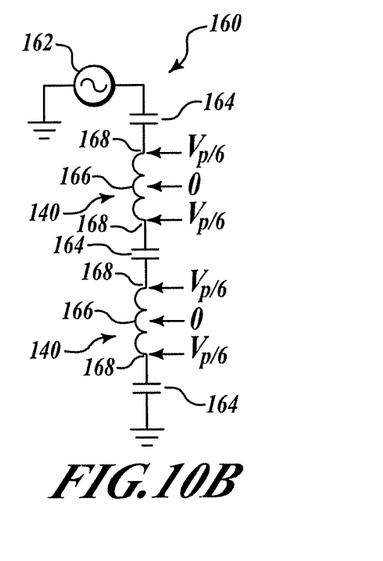

The effect may be further enhanced by dividing the coil into a plurality of symmetrical segments, as shown in FIG. 10B. As shown in FIG. 10B, subdividing the coil 140 into two symmetrical segments reduces peak voltage $V_p$ to one-quarter of the peak for an asymmetrical coil, $V_p/4$. Accordingly, dividing the coil into N segments, reduces peak voltage to $1/(2N)$ of the peak voltage of an asymmetrical coil, which is shown in FIG. 4 for comparison. When peak voltage $V_p$ has been reduced so that any voltage-induced effects to the quartz components of the plasma generator 100 are at an acceptable level, there is no longer any need for a Faraday shield.

Figure 8:
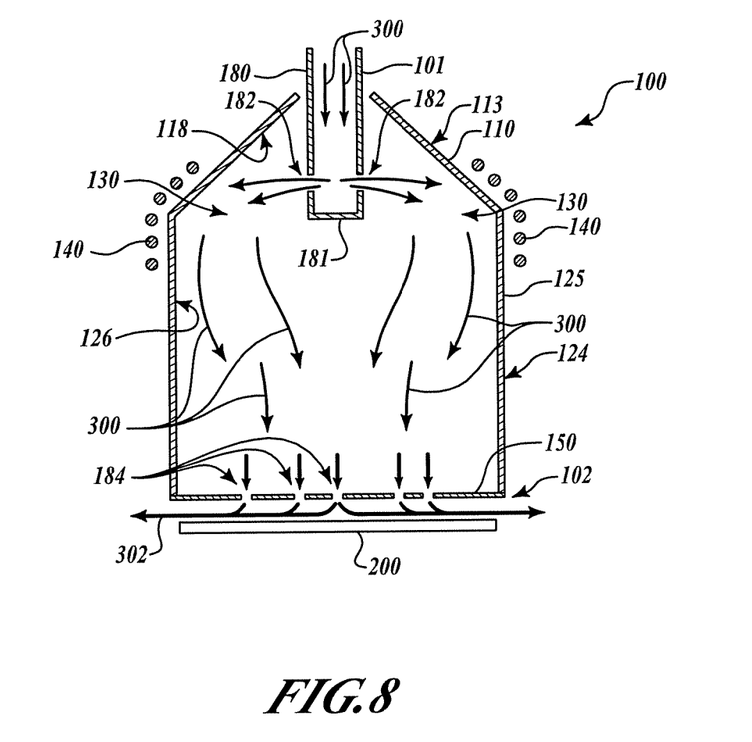
FIG. 8 is a simplified side view in cross section of a large diameter plasma generator in accordance with an exemplary embodiment that utilizes an alternative embodiment of a gas dispersion nozzle, and a quartz container with a conical upper portion.

In accordance with an exemplary embodiment of the present invention, illustrated schematically in FIG. 8, the gas inlet 101 is of a different design than the nozzle 114 of FIG. 5.

The inlet 101 includes a tube 180 that has a closed end 181, and a series of outlet holes 182 in the vicinity of the closed end 181 that direct gas to the region 130, proximate an intersection between the dome or cone 110 and the tube 125. Region 130 is adjacent induction coil 140 that is wrapped around the outer surface 113 of the dome 110 and the outer surface 124 of the tube 125 to provide excitation energy to gas in region 130. In region 130, the gas 300 is ionized and flows downward in the cylindrical container 125 to outlet 102. At the outlet 102, the gas encounters a gas distributor plate 150 which neutralizes some charged gas species that were formed during gas ionization. The gas stream 300 passes through holes or pores 184 in gas distributor 150, and exits as gas stream 302 to impinge on an upper surface of the work piece 200 to perform a desired function, such as surface ashing.

Figure 9:
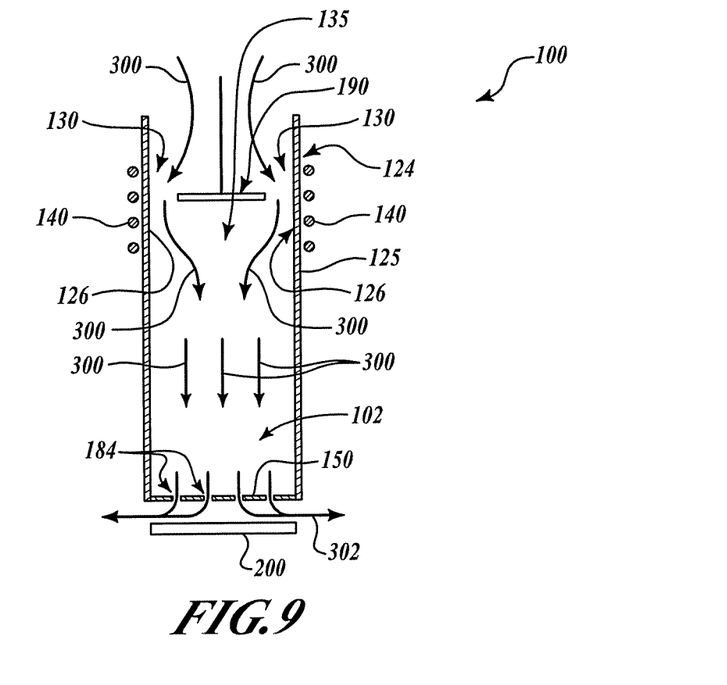
FIG. 9 is a simplified side view in cross section of a plasma generator in accordance with another exemplary embodiment utilizing a flow directing baffle.

FIG. 9 illustrates another exemplary embodiment of a plasma generator apparatus 100. This apparatus lacks a dome or cone upper section. Rather, incoming gas flows into an apparatus 100 that includes a tube 125 and is diverted within the tube 125 to flow around an axially-centered round baffle plate 190. This diversion causes gas stream 300 to flow towards sides of the inner wall 126. An induction coil 140 surrounds the outer surface 124 of container 125 in an area adjacent region 130 where the diverted gas flow 300 impacts the inner wall 126 of the container 125. The induction coil 140 applies energy in that region 130 to ionize gas components. By diverting gas out of the central region 135 of the tube and forcing the gas towards the inner walls 126 of the tube, gas flow is forced into region 130 and gas is concentrated in that region 130. The application of energy to the concentrated gas results in a greater ionization of the gas. The diameter of the baffle plate 190, or other characteristic baffle dimension if not a circular baffle, may be selected taking into account the inside diameter 120 of tube 125 and the gas flow rate, to determine an optimum gas flow rate and pressure in the region 130 in which the gas is closest to the coil 140. After ionization, the gas 300 then flows downward in the cylindrical container 125 to outlet 102. At the outlet 102, the gas encounters a gas distributor plate 150 which neutralizes some of the charged gas species that were formed during gas ionization. The gas stream 300 passes through holes or pores 184 in gas distributor 150, and exits as gas stream 302 to impinge on an upper surface of the work piece 200 to perform a desired function, such as surface ashing.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A remote plasma generator configured to generate plasma for ashing a large diameter substrate, comprising:
   a conical upper portion comprising a narrow end and a wide end;
   a gas flow tube comprising a top end and a bottom end, the top end of the gas flow tube attached to and capping the wide end of the conical upper portion, a part of the gas flow tube and a part of the conical upper portion being continuously surrounded by a symmetrical coil, the symmetrical coil connected to a first capacitor at one end of the symmetrical coil and to a second capacitor at the other end of the symmetrical coil;
   a gas distribution nozzle attached to the narrow end of the of the conical upper portion, the gas distribution nozzle comprising a hemispherical tip having a first plurality of through holes configured for preferentially directing an incoming flow of gas along sidewalls of the conical upper portion and toward sidewalls of the gas flow tube, the first plurality of through holes further configured to form a region of higher gas density to provide higher plasma density inside the plasma generator proximate an interface between the conical upper portion and the gas flow tube than in regions not proximate the interface between the conical upper portion and the gas flow tube; and
   a gas distribution plate attached to the bottom end of the gas flow tube, the gas distribution plate comprising a second plurality of through holes for distributing and directing an outgoing flow of the gas out of the plasma generator and to the substrate positioned outside of the remote plasma generator, the gas distribution plate having a diameter substantially the same as the substrate.

2. The plasma generator of claim 1, wherein the conical upper portion and the gas flow tube comprise quartz.

3. The plasma generator of claim 1, wherein the second plurality of through holes is configured to distribute and direct the outgoing gas flow out of the plasma generator in a direction substantially perpendicular to the substrate.

4. The plasma generator of claim 1, wherein the first plurality of through holes of the gas distribution nozzle is configured to direct the incoming gas flow substantially parallel to an inner wall of the conical upper portion.

5. The plasma generator of claim 1, wherein the first plurality of through holes is arranged in a circle on the hemispherical tip of the gas distribution nozzle.

6. The plasma generator of claim 1, wherein the symmetrical coil comprises a third capacitor interconnecting two segments of the symmetrical coil.

7. The plasma generator of claim 1, fresher comprising a Faraday shield positioned between the symmetrical coil and the part of the conical upper portion and between the symmetric coil and the part of the gas flow tube.

8. The plasma generator of claim 1, wherein the plasma generator is free of a Faraday shield in between the symmetrical coil and the part of the conical upper portion and between the symmetric coil and the part of the gas flow tube.

9. The plasma generator of claim 1, wherein the symmetrical coil is configured to produce a plasma-generating energy field having a peak power adjacent to the interface between the conical upper portion and the gas flow tube.

10. The plasma generator of claim 1, wherein the symmetrical coil comprises at least two segments.

11. The plasma generator of claim 1, wherein the diameter of the gas distribution plate is between about 200 mm and 500 mm.

12. The plasma generator of claim 1, wherein the diameter of the gas distribution plate is about 300 mm.

13. The plasma generator of claim 1, wherein the diameter of the gas distribution plate is between about 300 mm and 500 mm.

14. The plasma generator of claim 1, wherein the hemispherical tip comprises a distal closed tip portion, and wherein the first plurality of through holes are arranged circumferentially aligned the hemispherical tip adjacent to the distal closed tip portion.

15. The plasma generator of claim 1, wherein the first plurality of through holes comprises a plurality of pairs of diametrically opposed through holes that are arranged circumferentially along the hemispherical tip.

16. The plasma generator of claim 1, wherein the first plurality of through holes are formed through the hemispherical tip at an incline relative to the gas distribution plate, the incline being parallel to inside walls of the conical upper portion.

17. The plasma generator of claim 1, wherein the first plurality of through holes for directing all incoming gas flow toward the region inside the plasma generator adjacent to the region adjacent to the interface between the conical upper portion and the gas flow tube.

18. A remote plasma generator configured to generate plasma for ashing a large diameter substrate, comprising:
- a conical upper portion comprising a narrow end and a wide end;
- a gas flow tube comprising a top end and a bottom ends the top end of the gas flow tube attached to the wide end of the conical upper portion, the conical upper portion and the gas flow tube comprising quartz, a part of the gas flow tube and a part of the conical upper portion being continuously surrounded by a symmetrical coil, the symmetrical coil connected to a first capacitor at one end of the symmetrical coil and to a second capacitor at the other end of the symmetrical coil;
- a gas distribution nozzle attached to the narrow end of the of the conical upper portion, the gas distribution nozzle comprising a hemispherical tip having a first plurality of through holes arranged in a circle on the hemispherical tip, the first plurality of through holes is configured for preferentially directing an incoming flow of gas along sidewalls of the upper conical portion and toward sidewalls of the gas flow tube, the first plurality of through holes further configured to form a region of higher gas density to provide higher plasma density inside the plasma generator proximate an interface between the conical upper portion and the gas flow tube than in regions not proximate the interface between the conical upper portion and the gas flow tube; and
- a gas distribution plate having a diameter of between about 300 mm and 500 mm and being attached to the bottom end of the gas flow tube, the gas distribution plate comprising a second plurality of through holes for distributing and directing an outgoing flow of the gas out of the plasma generator to the substrate positioned outside of the remote plasma generator, the outgoing flow of the gas being directed in a direction substantially perpendicular to the substrate.

19. A remote plasma generator configured to generate plasma for ashing a large diameter substrate, comprising:
- a domed upper portion comprising a narrow end and a wide end;
- a gas flow tube comprising a top end and a bottom end, the top end of the gas flow tube attached to the wide end of the domed upper portion, a part of the gas flow tube and a part of the conical upper portion being continuously surrounded by a symmetrical coil, the symmetrical coil connected to a first capacitor at one end of the symmetrical coil and to a second capacitor at the other end of the symmetrical coil;
- a gas distribution nozzle attached to the narrow end of the of the domed upper portion, the gas distribution nozzle comprising a hemispherical tip having a first plurality of through holes configured for preferentially directing an incoming flow of gas toward sidewalls of the gas flow tube, the first plurality of through holes further configured to form a region of higher gas density to provide higher plasma density inside the plasma generator proximate an interface between the domed upper portion and the gas flow tube than in regions not proximate the interface between the domed upper portion and the gas flow tube; and
- a gas distribution plate attached to the bottom end of the gas flow tube, the gas distribution plate comprising a second plurality of through holes for distributing and directing an outgoing flow of the gas out of the remote plasma generator and to the substrate positioned outside of the remote plasma generator, the gas distribution plate having a diameter substantially the same as the substrate.

* * * * *